(12) United States Patent
Justason et al.

(10) Patent No.: US 7,511,970 B2
(45) Date of Patent: Mar. 31, 2009

(54) METHOD AND APPARATUS FOR SHIELDING A CIRCUIT BOARD OF A CIRCUIT BOARD CHASSIS

(75) Inventors: Eric Jon Justason, Apex, NC (US); Norman Lester Creekmore, Raleigh, NC (US); Timothy Podd, Milford, NH (US); James L. Korzik, Apex, NC (US)

(73) Assignee: Cisco Technology, Inc., San Jose, CA (US)

( * ) Notice: Subject to any disclaimer, the term of this patent is extended or adjusted under 35 U.S.C. 154(b) by 460 days.

(21) Appl. No.: 11/023,102

(22) Filed: Dec. 27, 2004

(65) Prior Publication Data

US 2006/0139895 A1    Jun. 29, 2006

(51) Int. Cl.
    *H05K 9/00* (2006.01)
(52) U.S. Cl. ...................................... 361/818
(58) Field of Classification Search ................ 361/818, 361/756
    See application file for complete search history.

(56) References Cited

U.S. PATENT DOCUMENTS

| | | | |
|---|---|---|---|
| 5,289,347 A | 2/1994 | McCarthy et al. | 361/809 |
| 5,335,147 A | 8/1994 | Weber | 361/818 |
| 5,570,270 A * | 10/1996 | Naedel et al. | 361/687 |
| 5,863,211 A * | 1/1999 | Sobotta et al. | 439/74 |
| 6,023,415 A * | 2/2000 | Mayer et al. | 361/816 |
| 6,198,362 B1 | 3/2001 | Harada et al. | 333/12 |
| 6,198,633 B1 * | 3/2001 | Lehman et al. | 361/756 |
| 6,209,842 B1 * | 4/2001 | Anderson et al. | 248/560 |
| 6,456,504 B1 * | 9/2002 | LoForte et al. | 361/799 |
| 6,674,650 B1 | 1/2004 | Davis et al. | 361/796 |
| 2003/0171033 A1 * | 9/2003 | Bright et al. | 439/607 |

* cited by examiner

*Primary Examiner*—Dean A. Reichard
*Assistant Examiner*—Abiy Getachew
(74) *Attorney, Agent, or Firm*—BainwoodHuang

(57) ABSTRACT

A circuit board shielding assembly includes an electrically conductive fabric over foam gasket that forms part of a circuit board card guide in a computer system. As a user inserts a circuit board assembly into the card guide of the computer system, a carrier tray of the circuit board assembly contacts the electrically conductive fabric of the gasket. The fabric over foam gasket also deforms to follow the geometric contours of the edges of the carrier tray. As such, the fabric over foam gasket forms a substantially continuous electrical contact with the carrier tray and forms part of a Faraday cage to provide EMI shielding to the circuit board. Additionally, the electrically conductive fabric includes certain material properties that cause the fabric to be substantially resistant to flaking electrically conductive fragments when as a user inserts the circuit board assembly within the card guide and generates a shear force relative to the electrically conductive fabric.

23 Claims, 4 Drawing Sheets

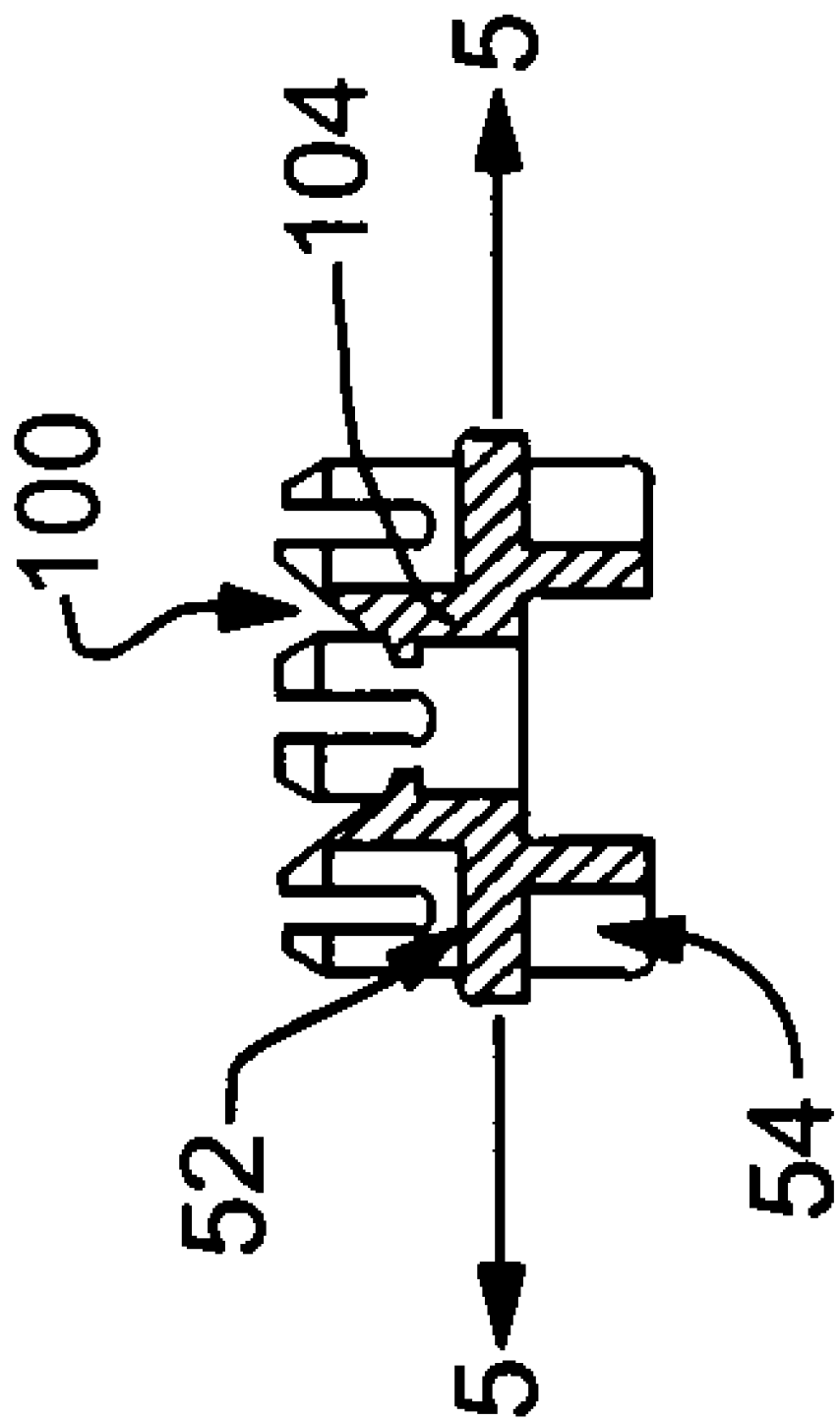

METHOD AND APPARATUS FOR SHIELDING A CIRCUIT BOARD OF A CIRCUIT BOARD CHASSIS

BACKGROUND

During operation, conventional circuit boards both radiate and conduct electromagnetic radiation. In a phenomenon known as electromagnetic interference (EMI), electromagnetic radiation generated by a circuit board can affect the function of other electronic devices (e.g., other circuit boards) in the vicinity of the circuit board. Also, electromagnetic radiation generated by the other electronic devices can affect the function or performance of the circuit board. EMI shielding devices help reduce emitted electromagnetic radiation from the radiation sources and also help protect the circuit board against electromagnetic radiation emissions from other radiation sources.

In conventional computer systems, the circuit boards include shielding elements that provide electromagnetic isolation from other electronics devices (e.g., circuit boards) in the computer system, thereby minimizing the effect of EMI on the circuit boards. For example, conventional circuit boards include carrier trays or supports. Each carrier tray typically covers a substantial portion of the associated circuit board. The carrier trays are formed of a metallic or electrically conductive material and, when grounded with an electrically conductive chassis of a computer system, attenuate or redirect EMI radiation relative to the circuit boards.

For example, the circuit board and carrier tray typically insert within a chassis of the computer system via card guides. The card guides provide grounding between the carrier tray and chassis to attenuate or redirect EMI radiation relative to the circuit board. For example, in one arrangement, a manufacturer integrally forms the card guides as part of the chassis using a stamping process. As a user inserts the circuit board and carrier tray into the stamped card guides, the carrier tray electrically contacts the stamped metal card guides. Such contact attenuates EMI radiation relative to the circuit board. In another example, a manufacturer uses a beryllium copper gasket in conjunction with the card guides of the computer device to provide grounding of the carrier tray to the chassis. A manufacturer attaches the beryllium copper gasket to the card guides using an adhesive. As a user inserts a circuit board and carrier tray into the card guides, the carrier tray electrically contacts the beryllium copper gasket. Such contact attenuates EMI radiation relative to the circuit board.

SUMMARY

By contrast to conventional circuit board shielding systems, an improved circuit board shielding assembly includes an electrically conductive fabric over foam gasket that forms part of a circuit board card guide in a computer system. As a user inserts a circuit board assembly into the card guide of the computer system, a carrier tray of the circuit board assembly contacts the electrically conductive fabric of the gasket. The fabric over foam gasket also deforms to follow the geometric contours of the edges of the carrier tray. As such, the fabric over foam gasket forms a substantially continuous electrical contact (e.g., ground) with the carrier tray and forms part of a Faraday cage to provide EMI shielding to the circuit board. Additionally, the electrically conductive fabric includes certain material properties that cause the fabric to be substantially resistant to flaking electrically conductive fragments when as a user inserts the circuit board assembly within the card guide and generates a shear force (e.g., rubbing between the carrier tray and the fabric of the gasket) relative to the electrically conductive fabric. By minimizing the formation of electrically conductive fragments, the electrically conductive fabric minimizes the potential for electrical shorting of electrical components of the computer system, as caused by the presence of the electrically conductive fragments within the computer system.

In one arrangement, a circuit board shielding assembly has a circuit board chassis, a card guide coupled to the circuit board chassis, and a gasket having an electrically conductive fabric forming an outer surface of the gasket. The card guide is configured to receive a circuit board and orient the circuit board within the circuit board chassis. The card guide couples the gasket to the circuit board chassis and the gasket forms an edge of an electromagnetic interference shielding cage relative to the circuit board. The gasket forms a substantially continuous electrical contact (e.g., ground) with the carrier tray and contributes in providing EMI shielding to the circuit board. Additionally, the electrically conductive fabric is substantially resistant to flaking electrically conductive fragments when a user inserts the circuit board assembly within the card guide. The electrically conductive fabric minimizes the potential for electrical shorting of electrical components of the computer system, as caused by the presence of the electrically conductive fragments within the computer system.

In one arrangement, the circuit board chassis of the circuit board shielding assembly defines a first gasket relief opening at a first end of the circuit board chassis. Also, the card guide defines a first gasket coupling element oriented at a first end of the card guide. The first gasket coupling element positions a leading end of the gasket within the first gasket relief opening such that the leading end of the gasket forms an angle relative to the circuit board mounting surface of the card guide. By angling the leading end of the gasket, the first gasket coupling element and the first gasket relief opening limit the ability for the circuit board assembly to snag or crumple the gasket along the long axis of the gasket as a user inserts the circuit board assembly within the chassis. The first gasket coupling element and the first gasket relief opening therefore ensure substantially continuous electrical contact between the gasket and the carrier tray.

BRIEF DESCRIPTION OF THE DRAWINGS

The foregoing and other features will be apparent from the following description of particular embodiments of the apparatus, as illustrated in the accompanying drawings in which like reference characters refer to the same parts throughout the different views. The drawings are not necessarily to scale, emphasis instead being placed upon illustrating general principles of the apparatus.

FIG. 6 illustrates a sectional view of a snap-fit latch mechanism illustrated in FIG. 5.

DETAILED DESCRIPTION

An improved circuit board shielding assembly includes an electrically conductive fabric over foam gasket that forms part of a circuit board card guide in a computer system. As a user inserts a circuit board assembly into the card guide of the computer system, a carrier tray of the circuit board assembly contacts the electrically conductive fabric of the gasket. The fabric over foam gasket also deforms to follow the geometric contours of the edges of the carrier tray. As such, the fabric over foam gasket forms a substantially continuous electrical contact (e.g., ground) with the carrier tray and forms part of a Faraday cage to provide EMI shielding to the circuit board. Additionally, the electrically conductive fabric includes certain material properties that cause the fabric to be substantially resistant to flaking electrically conductive fragments when as a user inserts the circuit board assembly within the card guide and generates a shear force (e.g., rubbing between the carrier tray and the fabric of the gasket) relative to the electrically conductive fabric. By minimizing the formation of electrically conductive fragments, the electrically conductive fabric minimizes the potential for electrical shorting of electrical components of the computer system, as caused by the presence of the electrically conductive fragments within the computer system.

Figure 1:
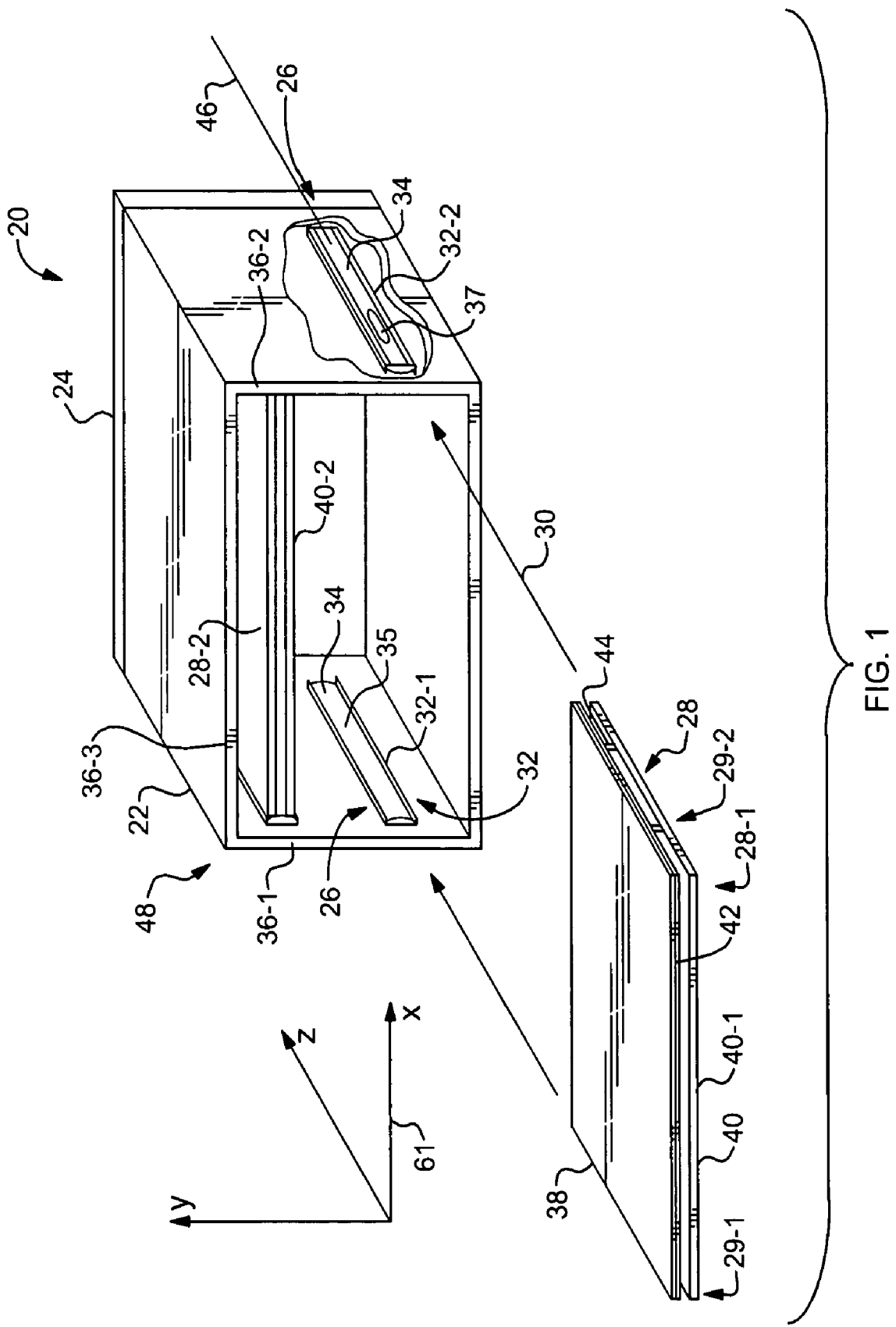
FIG. 1 is a perspective view of a computer system having a grounding assembly.

FIG. 1 shows an arrangement of a computer system 20. The computer system 20 includes a metallic card cage or circuit board chassis 22, a back plane 24, and shielding assemblies 26. The system 20 further includes multiple circuit board assemblies 28-1, 28-2, given generally as 28, that connect with the back plane 24 when installed in the card cage 22, via the shielding assemblies 26, in the direction 32.

Each circuit board assembly 28 includes a circuit board 38 and a carrier tray or support 40. The circuit board 38 includes multiple nonconductive (e.g., fiberglass) and conductive (e.g., copper) layers. The multiple conductive layers carry signals among circuit board components mounted to the circuit board 38 and in contact with the conductive layers. One of the multiple conductive layers of the circuit board 38 is configured as a ground plane 42 that carries or conducts a ground signal within the circuit board 38, such as a chassis ground signal.

The carrier tray 40 couples to the circuit board 38 via side portions or stand-offs 44 attached to the carrier tray 40 and operates as a carrier for holding the circuit board 38 in place for proper alignment and connection with the back plane 24. The carrier tray 40 is formed from a metallic material, such as stainless steel, that shields the circuit board 38 from external electromagnetic interference (EMI) sources and that shields external circuitry from EMI generated by the circuit board 38. The carrier tray 40 also electrically couples to the ground plane 42 of the circuit board 38 via the stand-offs 44.

The shielding assembly 26 includes a card guide 32 configured to receive and support the circuit board assembly 28-1 when the circuit board assembly 28-1 connects with the back plane 24 of the computer system 20. In one arrangement, the card guide 32 includes a first card guide 32-1 coupled to a first wall 36-1 of the chassis 22 and a second card guide 32-1 coupled to a second wall 36-2 of the chassis 22 and opposing the first card guide 32-1. In such an arrangement, the card guides 32-1, 32-2 support opposing edges 29-1, 29-2 of the carrier tray 40 of the circuit board assembly 28-1 and allow proper alignment and orientation of the circuit board assembly 28-1 relative to the circuit board chassis 22 and the back plane 24 of the computer system 20.

In one arrangement, the card guide 32 is formed from a non-metallic material, such as a plastic material. Conventional card guides are formed of a metallic material that can generate metal flakes or fragments caused by metal-on-metal rubbing between conventional metal carrier trays and the conventional metal card guides. The non-metallic or plastic card guide 32 minimizes "snagging" of the circuit board assembly 28-1 on the card guide 32 as a user inserts or removes the circuit board assembly 28-1 relative to the chassis 22. By minimizing "snagging" of the circuit board assembly 28-1 on the card guide 32, the non-metallic card guide 32 minimizes the formation of electrically conductive debris between the circuit board assembly 28 and the card guide 32 as the user inserts or removes the circuit board assembly 28 relative to the chassis 22.

The shielding assembly 26 also includes an electrically conductive gasket 34. The card guide 32 secures (e.g., captivates) the electrically conductive gasket 34 to the chassis 22 and allows the gasket 34 to electrically contact the carrier tray 40 of the circuit board assembly 28-1. As such, the gasket 34 forms an edge of an electromagnetic interference shielding cage 48 relative to the circuit board 38, described below.

The gasket 34 has an electrically conductive fabric 35, such as a nickel-based fabric, that forms an outer surface or outer portion of the gasket 34. The electrically conductive fabric 35 provides an EMI shielding connection between the carrier tray 40 of the circuit board assembly 28-1 and the chassis 22 (e.g., the walls 36-1, 36-2 of the chassis 22). The gasket 34 also has a substantially compliant inner portion 37, such as formed from a foam material, covered by the electrically conductive fabric 35. The compliant inner portion 37 of the gasket 34 is configured to deform when a circuit board assembly 28-1 inserts within the card guide 32 to substantially follow a contour of an edge of the circuit board assembly 28-1.

During installation of a circuit board assembly 28-1 within the computer system 20, a user aligns the edges 29-1, 29-2 of the carrier tray 40 with the corresponding card guides 32-1, 32-2 of the chassis 22 and inserts of the circuit board assembly 28-1 into the chassis 22 along the direction 30. As the circuit board assembly 28-1 inserts within the card guides 32-1, 32-2, the carrier tray 40 generates a shear stress on the gasket 34 (e.g., along a long axis 46 of the gasket 34) and compresses the gasket 34 (e.g., the compliant inner portion 37) relative to an x-axis direction. As the carrier tray 40 compresses the gasket 34, the gasket 34 deforms to follow the geometry of the edges 29-1, 29-2 of the carrier tray 40. The gasket 34 (e.g., the electrically conductive fabric 35 of the gasket 34) provides substantially continuous electrical contact with the edges 29-1, 29-2 of the carrier tray 40 and, therefore, provides substantially continuous EMI grounding between the chassis 22 and the carrier tray 40. As such, the carrier tray 40, gasket 34, and side walls 36-1, 36-2 and upper wall 36-3 of the chassis 22 forms the electromagnetic interference shielding cage or Faraday cage 48 relative to the circuit board 38 to provide EMI shielding to the circuit board 38.

For example, as indicated above, the carrier tray 40 is formed from a metallic material that shields the circuit board 38 from EMI. When a circuit board assembly 28 inserts within the card guide 32, the carrier tray 40 electrically contacts the gasket 34. The gasket 34, in turn, electrically contacts the side walls 36-1, 36-2 of the metallic chassis 22 as well as an upper wall 36-3 of the chassis 22. The combination of the carrier tray 40, gasket 34, side walls 36-1, 36-2, and upper wall 36-3 forms a Faraday cage 48 relative to the circuit board 38 and provides EMI shielding to the circuit board 38.

Compression of the gasket 34 by the edges 29-1, 29-2 of the carrier tray 40 provides substantially continuous EMI shielding between the edges 29-1, 29-2 if the carrier tray 40 and the chassis 22. For example, because the carrier tray 40 compresses the gasket 34 (e.g., along the x-axis direction), the gasket 34 maintains substantially continuous (e.g., as opposed to intermittent) electrical contact with the carrier tray 40, regardless of the presence of any irregularities in the geometry of the edges 29-1, 29-2 of the carrier tray 40. The compliant inner portion 37 of the gasket in combination with the conductive fabric outer portion 35, therefore, absorb any irregularities in the geometry of the edges 29-1, 29-2 of the carrier tray 40. By maintaining substantially continuous electrical contact with the carrier tray 40, the gasket 34 helps to minimize EMI radiation emitted from or received by the circuit board 38. Additionally, by providing substantially continuous electrical contact between the ground plane 42 o the circuit board 38, via the carrier tray 40, and the chassis 22, the gasket 34 minimizes or eliminates the presence of ground loops on the circuit board 38, and, as such, minimizes radiated emissions from the circuit board 38.

During assembly, as the user inserts the circuit board assembly 28-1 within the chassis 22, the edges 29-1, 29-2 of the carrier tray 40 rubs against the conductive fabric 35 of the gasket 34 as cause by the shear force generated between the carrier tray 40 and the gasket 34. When exposed to such rubbing or shear forces, the configuration of the electrically conductive fabric 35 minimizes flaking or shedding of electrically conductive fragments or debris. Use of the electrically conductive fabric 35 as part of the gasket 34, therefore, minimizes or eliminates the formation of electrically conductive debris within the computer system 20, as caused by the circuit board assembly 28-1. By minimizing the formation of electrically conductive debris, the presence of the electrically conductive fabric 35 limits the potential for electrical shorting of the electrical components of the computer system 20, as caused by electrically conductive debris within the computer system 20.

FIGS. 2-6 illustrate an example arrangement of the card guide 32, gasket 34, and chassis 22 of the circuit board shielding assembly 26 of FIG. 1.

The card guide 32 has a base 50 that defines a first surface or chassis mounting surface 52 and a second surface or circuit board mounting surface 54. The chassis mounting surface 52 of the card guide 32 opposes the wall 36-1 of the chassis 22 and contacts a portion of the gasket 34 when the card guide 32 mounts to the chassis 22 (e.g., along direction 60). As such, the chassis mounting surface 52 of the card guide 32 secures the gasket 34 to the chassis 22 when the card guide 32 mounts to the chassis 22. The circuit board mounting surface 54 is configured to support and orient the circuit board assembly 28 within the chassis 22 when a user inserts the circuit board assembly 28 within the chassis 22.

For example, the base 50 has a first rail 56-1 and a second rail 56-2 substantially parallel to the first rail 56-1, given generally as rails 56, extending from the circuit board mounting surface 54. The first rail 56-1 and the second rail 56-2 define a groove or slot 57 such that a width of the slot 57 (e.g., the distance between the first rail 56-1 and the second rail 56-2) corresponds to a width of the circuit board assembly 28. Such correspondence between the with of the slot 57 and the width of the circuit board assembly 28 minimize translation of the circuit board assembly 28 within the chassis 22 along a y-axis direction 62, such as caused by vibration of the computer system 20, thereby minimizing the generation of wear debris between the carrier tray 40 and the card guide 32.

The base 50 further defines a gasket opening 58 (e.g., a first gasket opening 58-1 and a second gasket opening 58-2) oriented between the rails 56, for example. The gasket openings 58 allow the gasket 34 to extend past the circuit board mounting surface 54 when the card guide 32 mounts to the chassis 22 (e.g., along direction 60). Extension of the gasket 34 beyond the circuit board mounting surface 54 of the card guide 32 ensures contact between the gasket 34 and the carrier tray 40 when the circuit board assembly 28 inserts within the chassis 22.

For example, when a user inserts the circuit board assembly 28 within the slot 57 (e.g., between the rails 56) of the card guide 32, the edge 29 of the carrier tray 40 orients in relative proximity to the circuit board mounting surface 54 of the card guide 32. Because the gasket opening 58 causes the gasket 34 to extend past the circuit board mounting surface 54 and because of the relative geometry of the edge 29 of the carrier tray 40 and the circuit board mounting surface 54, the gasket opening 58 ensures that the edge 29 of the carrier tray 40 deforms the gasket 34 when a user inserts the carrier tray 40 within the card guide. The gasket opening, therefore, allows substantially continuous electrical contact between the carrier tray 40 and the gasket 34.

As indicated above, the circuit board assembly 28 generates a shear stress on the gasket 34 when a user inserts or removes the circuit board assembly 28 relative to the chassis 22. Conventionally, application of a shear stress to an electrically conductive fabric over foam gasket, relative to a long axis of the gasket, causes the gasket to crumple or fold upon itself along the long axis. To minimize such folding of the gasket 34 when exposed to a shear load or shear stress and to maximize a surface area of contact between the gasket 34 and the carrier tray 40, the card guide 32 and the chassis 22 are configured to form portions of the gasket 34 into angled portions or "knife" edges, as described below.

Figure 2:
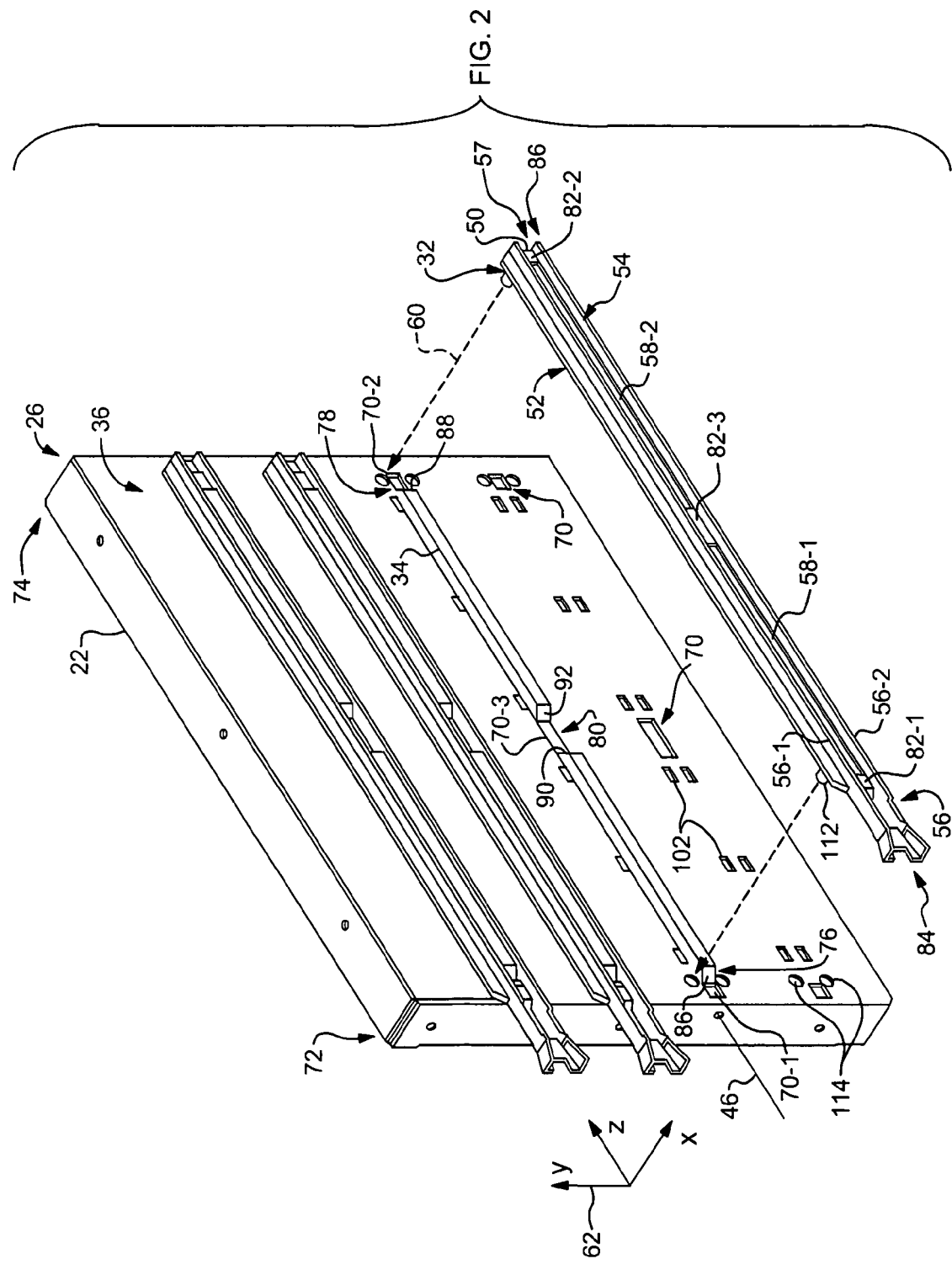
FIG. 2 illustrates an arrangement of a wall of the computer system of FIG. 1.
Figure 3:
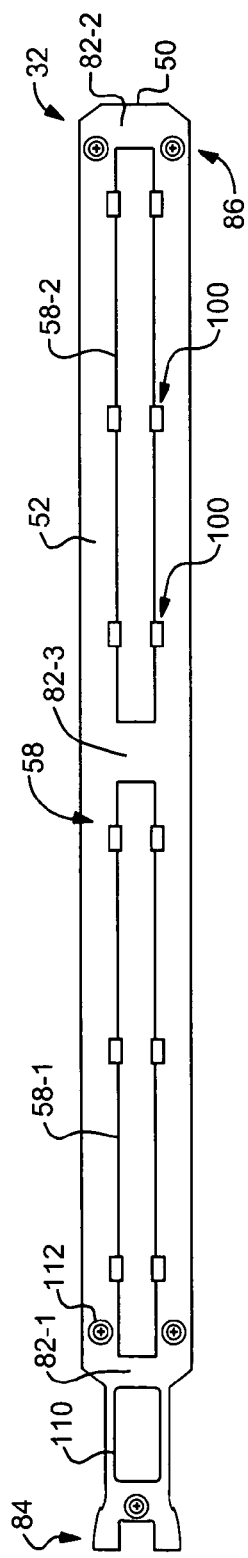
FIG. 3 illustrates a rear view of an arrangement of a card guide illustrated in FIG. 2.
Figure 4:
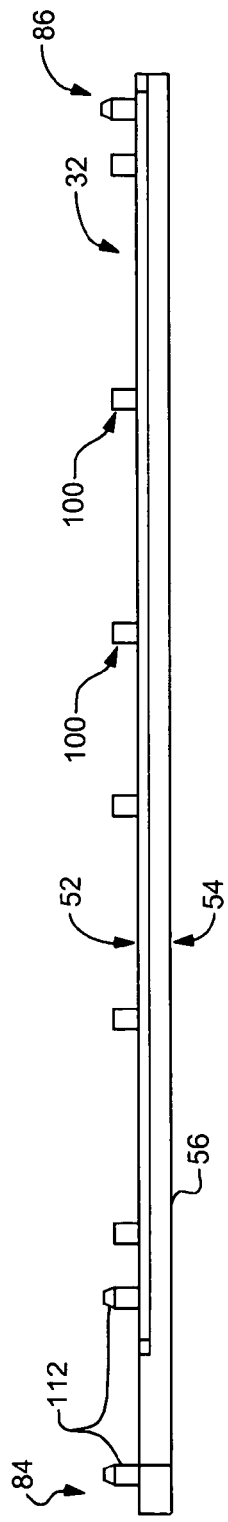
FIG. 4 illustrates a side view of the card guide illustrated in FIG. 2.
Figure 5:
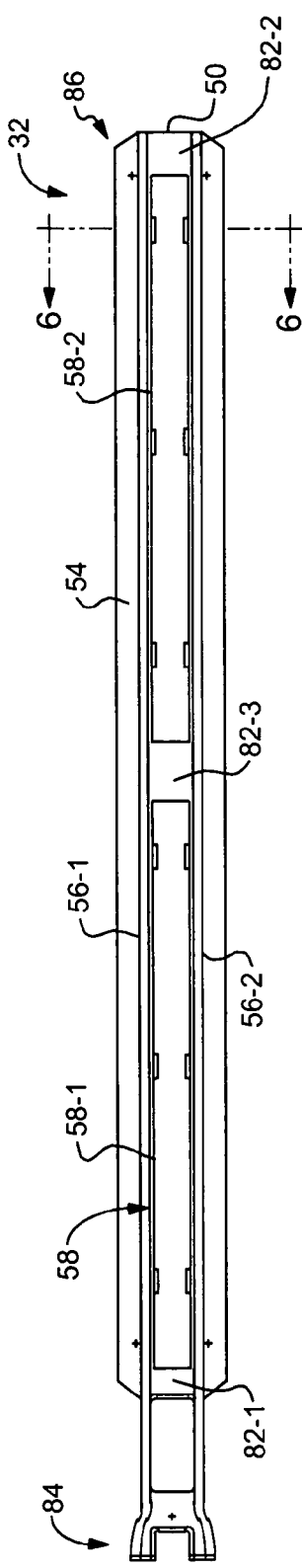
FIG. 5 illustrates a front view of the card guide illustrated in FIG. 2.

Referring to FIG. 2, the circuit board chassis 22 defines gasket relief openings 70 within the wall 36 of the chassis 22. For example, the circuit board chassis 22 defines a first gasket relief opening 70-1 at a first end 72 of the circuit board chassis 22, a second gasket relief opening 70-2 at a second end 74 of the circuit board chassis 22, and central gasket relief opening 70-3 oriented (e.g., centrally oriented) between the first end 72 and the second end 74 of the circuit board chassis 22. The gasket relief openings 70 are configured to receive and contain portions of the gasket 34 during assembly.

The card guide 32 includes gasket coupling elements 82 configured to position the portions of the gasket 34 relative to the gasket relief openings 70 to form the portions of the gasket into angled or "knife" edges. For example, the card guide 32 has a first gasket coupling element 82-1 oriented at a leading end 84 of the card guide 32, a second gasket coupling element 82-2 oriented at a trailing end 86 of the card guide 32, and a central gasket coupling element 82-3 oriented between the leading end 84 and the trailing end 86 of the card guide 32.

During assembly, a user places the gasket 34 in proximity to the wall 26 of the chassis 22. The user then couples the card guide 32 to the chassis wall 26.

For example, as the card guide 32 couples to the chassis wall 26, the first gasket coupling element 82-1 contacts the leading end 76 of the gasket 34 and inserts the leading end 76 of the gasket 34 within the corresponding first gasket relief opening 70-1. Such insertion causes the first gasket coupling element 82-1 to form or generate an angle 86 in the leading end 76 of the gasket 34 relative to the circuit board mounting surface 54 of the card guide 32. By angling the leading end 76 of the gasket 34, the first gasket coupling element 82-1 and the first gasket relief opening 70-1 limit the ability for the circuit board assembly 28 to snag or crumple the gasket 34 along the long axis 46 of the gasket 34 as a user inserts the circuit board assembly 28 within the chassis 22.

Also, as the card guide 32 couples to the chassis wall 26, the second gasket coupling element 82-2 contacts the trailing end 78 of the gasket 34 and inserts the trailing end 78 of the gasket 34 within the corresponding second gasket relief opening 70-2. Such insertion causes the second gasket coupling element 82-2 to form or generate an angle 88 in the trailing end 78 of the gasket 34 relative to the circuit board mounting surface 54 of the card guide 32. By angling the trailing end 78 of the gasket 34, the second gasket coupling element 82-2 and the second gasket relief opening 70-2 limit the ability for the circuit board assembly 28 to snag or crumple the gasket 34 along the long axis 46 of the gasket 34 as a user removes the circuit board assembly 28 from the chassis 22.

Also as the card guide 32 couples to the chassis wall 26, the central gasket coupling element 82-3 contacts a central portion 80 of the gasket 34 and inserts the central portion 80 of the gasket 34 within the corresponding central gasket relief opening 70-3. Such insertion causes the central gasket coupling element 82-3 to form or generate two angles 90, 92 in the central portion 80 of the gasket 34 relative to the circuit board mounting surface 54 of the card guide 32. For example, the central gasket coupling element 82-3 forms a central trailing edge angle 90 and a central leading edge angle 92 relative to the circuit board mounting surface 54. By generating the central trailing edge angle 90 and the central leading edge angle 92 within the central portion 80 of the gasket 34, the central gasket coupling element 82-3 and the central gasket relief opening 70-3 limit the ability for the circuit board assembly 28 to snag or crumple the central portion 80 of the gasket 34 along the long axis 46 of the gasket 34 as a user inserts or removes the circuit board assembly 28 relative to the chassis 22.

As indicated above, in one arrangement, the card guide 32 is formed from a non-metallic material to minimizes "snagging" of the circuit board assembly 28 on the card guide 32 as a user inserts or removes the circuit board assembly 28 relative to the chassis 22. As illustrated FIGS. 3 and 4, in order to secure or couple the card guide 32 to the chassis 22, the card guide 32 includes attachment elements 100 (e.g., snaps) extending from the chassis mounting surface 54 of the base 50 of the card guide 32. The attachment elements 100 are integrally-formed with the card guide 32 and insert within corresponding card guide attachment openings 102 defined by the chassis 22. During assembly, when a user inserts the attachment elements 100 within the corresponding card guide attachment openings, the attachment element 100 mechanically attach to the wall 26 of the chassis 22 to secure the card guide 32 to the circuit board chassis 22.

FIG. 6 illustrates an arrangement of the attachment element 100. In such an arrangement, the attachment elements 100 are configured as latches (e.g., snap-fit latch mechanisms) 104 that insert within the card guide attachment openings 102 defined by the chassis 22 and mechanically couple to the wall 26 of the chassis. The latches 104 allow the user to "snap-in" the card guides 32 into the chassis 22 during insertion. The latches 104 also allow a user to remove the card guide 32 from the chassis 22, such as in the event of failure or excessive wear of the card guide 32.

Returning to FIGS. 2, 3 and 4, the card guide includes alignment elements 112 that extend from the chassis mounting surface 52 of the base 50 of the card guide 32. The alignment elements 112 are configured to insert within corresponding alignment openings 114. As a user attaches the card guide 32 to the chassis 22, the alignment elements 112 insert within the alignment openings 114 defined by the chassis 22 and secure to the chassis by an interference or friction fit between the alignment elements 112 and the alignment openings 114. The alignment elements 112 and corresponding alignment openings 114 orient sets of card guides 32-1, 32-2 within the chassis 22 (e.g., card guides 32 located on opposing walls 36 of the chassis 22 and configured to receive a single circuit board assembly 28) such that the card guides 32-1, 32-2 are substantially parallel to each other. Use of the alignment elements in conjunction with the alignment openings in the chassis, therefore, minimizes twisting of circuit board assemblies 28 as user inserts the circuit board assemblies 28 within the chassis 22.

Returning to FIG. 3, in one arrangement, the card guide defines air vent or opening 110. For example, the air vent orients at a leading end 84 of the card guide 32. The air vent 110 allows air from an air source, such as a fan, to enter the computer system 20 and cool the circuit boards 38 and other electrical components associated with the computer system 20.

While this invention has been particularly shown and described with references to embodiments thereof, it will be understood by those skilled in the art that various changes in form and details may be made therein without departing from the spirit and scope of the invention as defined by the appended claims.

For example, as indicated above, during installation of a circuit board assembly 28 within the computer system 20, a user aligns the edges 29-1, 29-2 of the carrier tray 40 with the corresponding card guides 32-1, 32-2 of the chassis 22 and inserts of the circuit board assembly 28 into the chassis 22 along the direction 30. The carrier tray 40 contacts and compresses the gasket 34 such that the gasket 34 deforms to follow the geometry of the edges 29-1, 29-2 of the carrier tray 40. The gasket 34 provides substantially continuous electrical contact with the edges 29-1, 29-2 of the carrier tray 40 and, therefore, provides substantially continuous EMI grounding between the chassis 22 and the carrier tray 40. Such description is by way of example only. In one arrangement, the user inserts a circuit board within the computer system 20, the circuit board defining an electrically conductive edge. As the user inserts the circuit board within the computer system, the electrically conductive edge of the circuit board contacts and compresses the gasket 34 such that the gasket 34 deforms to follow the geometry of the edge of the circuit board. In such an arrangement, the circuit board forms part of an electromagnetic interference shielding cage or Faraday cage that provides EMI shielding to the circuit board.

In another example, as described above, the gasket 34 provides substantially continuous electrical contact with the edges 29-1, 29-2 of the carrier tray 40 and, therefore, provides substantially continuous EMI grounding between the chassis 22 and the carrier tray 40. As such, the carrier tray 40, gasket 34, and side walls 36-1, 36-2 and upper wall 36-3 of the chassis 22 forms the electromagnetic interference shielding cage or Faraday cage 48 relative to the circuit board 38 to provide EMI shielding to the circuit board 38. Such description is by way of example only. In one arrangement, returning to FIG. 1, a carrier tray 40-2 of a second circuit board assembly 28-2 forms the upper wall of the Faraday cage 48 relative to the circuit board 38 of a first circuit board assembly 28-1. For example, as a user inserts the first circuit board assembly 28-1 into the chassis, the gasket 34 provides substantially continuous electrical contact with the edges 29-1, 29-2 of the carrier tray 40-1 and, therefore, provides substantially continuous EMI grounding between the chassis 22 and the carrier tray 40. In such a configuration, the carrier tray 40, gasket 34, side walls 36-1, 36-2 of the chassis 22, and the second carrier tray 40-2 forms the electromagnetic interference shielding cage or Faraday cage 48 relative to the circuit board 38 of the first circuit board assembly 28-1 to provide EMI shielding to the circuit board 38.

What is claimed is:

1. A circuit board shielding assembly comprising:
    a circuit board chassis;
    a card guide coupled to the circuit board chassis, the card guide configured to receive a circuit board and orient the circuit board within the circuit board chassis; and
    a gasket having an electrically conductive fabric forming an outer surface of the gasket, the card guide coupling the gasket to the circuit board chassis, the gasket forming an edge of an electromagnetic interference shielding cage relative to the circuit board;
    wherein the card guide defines at least one gasket opening extending along a length of the card guide and within a channel of the card guide, the gasket disposed within the opening and extending from the circuit board chassis into the channel of the card guide when the card guide couples the gasket to the circuit board chassis.

2. The circuit board shielding assembly of claim 1 wherein the card guide comprises a base having a chassis mounting surface and a circuit board mounting surface, the chassis mounting surface coupled to the circuit board chassis and the circuit board mounting surface guide configured to receive the circuit board, the gasket extending past the circuit board mounting surface and configured to receive a shear stress and deform relative to the circuit board mounting surface upon reception of the circuit board by the card guide.

3. The circuit board shielding assembly of claim 2 wherein:
    the circuit board chassis defines a first gasket relief opening at a first end of the circuit board chassis; and
    the card guide defines a first gasket coupling element oriented at a first end of the card guide, the first gasket coupling element positioning a leading end of the gasket within the first gasket relief opening such that the leading end of the gasket forms an angle relative to the circuit board mounting surface of the card guide.

4. The circuit board shielding assembly of claim 3 wherein:
    the circuit board chassis defines a second gasket relief opening at a second end of the circuit board chassis; and
    the card guide defines a second gasket coupling element oriented at a second end of the card guide, the second gasket coupling element positioning a trailing end of the gasket within the second gasket relief opening such that the trailing end of the gasket forms an angle relative to the circuit board mounting surface of the card guide.

5. The circuit board shielding assembly of claim 2 wherein:
    the circuit board chassis defines a central gasket relief opening between a first end and a second end of the circuit board chassis; and
    the card guide defines a central gasket coupling element oriented between a first end and a second end of the card guide, the central gasket coupling element positioning a central portion of the gasket, oriented between a leading end and a trailing end of the gasket, within the central gasket relief opening such that the central portion of the gasket forms at least one angle relative to the circuit board mounting surface of the card guide.

6. The circuit board shielding assembly of claim 1 wherein the gasket comprises a fabric over foam gasket, the fabric forming an electrically conductive outer portion of the gasket and the foam forming an inner portion of the gasket.

7. The circuit board shielding assembly of claim 6 wherein the fabric over foam gasket is configured to receive a shear stress from the circuit board assembly relative to a long axis of the fabric over foam gasket when the circuit board assembly inserts within the card guide.

8. The circuit board shielding assembly of claim 2 wherein:
    the circuit board chassis defines at least one card guide attachment opening; and
    the card guide comprises at least one attachment element extending from the chassis mounting surface of the base of the card guide, insertion of the at least one attachment element within the at least one card guide attachment opening coupling the card guide to the circuit board chassis.

9. The circuit board shielding assembly of claim 1 wherein the card guide comprises a non-metallic material.

10. A computer system comprising:
    a circuit board chassis;
    circuit board shielding assembly having:
        a card guide coupled to the circuit board chassis, and
        a gasket having an electrically conductive fabric forming an outer surface of the gasket, the card guide coupling the gasket to the circuit board chassis; and
    a circuit board coupled to the card guide and in electrical communication with the gasket, the gasket forming an edge of an electromagnetic interference shielding cage relative to the circuit board;
    wherein the card guide defines at least one gasket opening extending along a length of the card guide and within a channel of the card guide, the gasket disposed within the opening and extending from the circuit board chassis into the channel of the card guide when the card guide couples the gasket to the circuit board chassis.

11. The computer system of claim 10 wherein the card guide comprises a base having a chassis mounting surface and a circuit board mounting surface, the chassis mounting surface coupled to the circuit board chassis and the circuit board mounting surface guide configured to receive the circuit board, the gasket extending past the circuit board mounting surface and configured to receive a shear stress and deform relative to the circuit board mounting surface upon reception of the circuit board by the card guide.

12. The computer system of claim 11 wherein:
    the circuit board chassis defines a first gasket relief opening at a first end of the circuit board chassis; and
    the card guide defines a first gasket coupling element oriented at a first end of the card guide, the first gasket coupling element positioning a leading end of the gasket within the first gasket relief opening such that the leading end of the gasket forms an angle relative to the circuit board mounting surface of the card guide.

13. The computer system of claim 12 wherein:
    the circuit board chassis defines a second gasket relief opening at a second end of the circuit board chassis; and
    the card guide defines a second gasket coupling element oriented at a second end of the card guide, the second gasket coupling element positioning a trailing end of the gasket within the second gasket relief opening such that the trailing end of the gasket forms an angle relative to the circuit board mounting surface of the card guide.

14. The computer system of claim 11 wherein:
    the circuit board chassis defines a central gasket relief opening between a first end and a second end of the circuit board chassis; and
    the card guide defines a central gasket coupling element oriented between a first end and a second end of the card guide, the central gasket coupling element positioning a central portion of the gasket, oriented between a leading end and a trailing end of the gasket, within the central gasket relief opening such that the central portion of the gasket forms at least one angle relative to the circuit board mounting surface of the card guide.

15. The computer system of claim 10 wherein the gasket comprises a fabric over foam gasket, the fabric forming an electrically conductive outer portion of the gasket and the foam forming an inner portion of the gasket.

16. The computer system of claim 15 wherein the fabric over foam gasket is configured to receive a shear stress from the circuit board assembly relative to a long axis of the fabric over foam gasket when the circuit board assembly inserts within the card guide.

17. The computer system of claim 11 wherein:
the circuit board chassis defines at least one card guide attachment opening; and
the card guide comprises at least one attachment element extending from the chassis mounting surface of the base of the card guide, insertion of the at least one attachment element within the at least one card guide attachment opening coupling the card guide to the circuit board chassis.

18. The computer system of claim 10 wherein the card guide comprises a non-metallic material.

19. The computer system of claim 10, wherein:
the gasket is disposed in electrical communication with the circuit board chassis; and
the circuit board comprises a carrier tray supporting the circuit board, the carrier tray disposed in electrical communication with a ground plane of the circuit board, the circuit board and carrier tray carried by the card guide such that the carrier tray is disposed in electrical communication with the gasket, the gasket, carrier tray, and the circuit board chassis forming at least part of an electromagnetic interference shielding cage relative to the circuit board.

20. The system of claim 19 wherein the gasket is configured to deform to follow geometric contours of at least one edge of the carrier tray along a length of the carrier tray to form a substantially continuous electrical contact with the of at least one edge of the carrier tray.

21. A computer system comprising:
a circuit board chassis;
circuit board shielding assembly having:
    a card guide coupled to the circuit board chassis, and
    a gasket having an electrically conductive fabric forming an outer surface of the gasket, the card guide coupling the gasket to the circuit board chassis, the gasket being disposed in electrical communication with the circuit board chassis; and
a circuit board assembly having a circuit board and carrier tray supporting the circuit board, the carrier tray disposed in electrical communication with a ground plane of the circuit board, the circuit board assembly carried by the card guide such that the carrier tray is disposed in electrical communication with the gasket, the gasket being configured to deform to follow geometric contours of at least one edge of the carrier tray along a length of the carrier tray to form a substantially continuous electrical contact with the of at least one edge of the carrier tray, the gasket, carrier tray, and the circuit board chassis forming at least part of an electromagnetic interference shielding cage relative to the circuit board;
wherein the card guide defines at least one gasket opening extending along a length of the card guide and within a channel of the card guide, the gasket disposed within the opening and extending from the circuit board chassis into the channel of the card guide when the card guide couples the gasket to the circuit board chassis.

22. The circuit board shielding assembly of claim 1, wherein:
the card guide comprises a first card guide coupled to a first wall of the chassis and a second card guide coupled to a second wall of the chassis, the second card guide opposing the first card guide and the second wall of the chassis opposing the first wall of the chassis; and
the card guide defining at least one gasket opening extending along a length of the card guide and within a channel of the card guide, the gasket disposed within the opening and extending from the circuit board chassis into the channel of the card guide when the card guide couples the gasket to the circuit board chassis comprises:
    the first card guide defining at least one gasket opening extending along a length of the first card guide and within a channel of the card guide, the gasket disposed within the opening and extending from the circuit board chassis into the channel of the first card guide when the first card guide couples the gasket to the first wall of circuit board chassis, and
    the second card guide defining at least one gasket opening extending along a length of the second card guide and within a channel of the card guide, the gasket disposed within the opening and extending from the circuit board chassis into the channel of the second card guide when the second card guide couples the gasket to the second wall of circuit board chassis;
the electrically conductive fabric of the gasket disposed within the opening of the first guide configured to provide a first edge of an electromagnetic interference shielding cage relative to a carrier tray of the circuit board and the first wall of the chassis, and
the electrically conductive fabric of the gasket disposed within the opening of the second guide configured to provide a second edge of an electromagnetic interference shielding cage relative to the carrier tray of the circuit board and the second wall of the chassis.

23. The computer system of claim 10, wherein:
the card guide comprises a first card guide coupled to a first wall of the chassis and a second card guide coupled to a second wall of the chassis, the second card guide opposing the first card guide and the second wall of the chassis opposing the first wall of the chassis; and
the card guide defining at least one gasket opening extending along a length of the card guide and within a channel of the card guide, the gasket disposed within the opening and extending from the circuit board chassis into the channel of the card guide when the card guide couples the gasket to the circuit board chassis comprises:
    the first card guide defining at least one gasket opening extending along a length of the first card guide and within a channel of the card guide, the gasket disposed within the opening and extending from the circuit board chassis into the channel of the first card guide when the first card guide couples the gasket to the first wall of circuit board chassis, and
    the second card guide defining at least one gasket opening extending along a length of the second card guide and within a channel of the card guide, the gasket disposed within the opening and extending from the circuit board chassis into the channel of the second card guide when the second card guide couples the gasket to the second wall of circuit board chassis;
the electrically conductive fabric of the gasket disposed within the opening of the first guide configured to pro vide a first edge of an electromagnetic interference shielding cage relative to a carrier tray of the circuit board and the first wall of the chassis, and the electrically conductive fabric of the gasket disposed within the opening of the second guide configured to provide a second edge of an electromagnetic interference shielding cage relative to the carrier tray of the circuit board and the second wall of the chassis.

* * * * *